US008243505B2

(12) United States Patent
Kang et al.

(10) Patent No.: US 8,243,505 B2
(45) Date of Patent: Aug. 14, 2012

(54) PHASE CHANGE MEMORY DEVICE HAVING WRITE DRIVING CONTROL SIGNAL CORRESPONDING TO SET/RESET WRITE TIME

(75) Inventors: Hee Bok Kang, Chungcheongbuk-do (KR); Suk Kyoung Hong, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 1104 days.

(21) Appl. No.: 12/134,527

(22) Filed: Jun. 6, 2008

(65) Prior Publication Data
US 2009/0040812 A1    Feb. 12, 2009

(30) Foreign Application Priority Data

Aug. 10, 2007    (KR) .................. 10-2007-0080661

(51) Int. Cl.
*G11C 11/00*    (2006.01)
(52) U.S. Cl. ......... 365/163; 365/100; 365/148; 977/754
(58) Field of Classification Search .................... 365/46, 365/94, 100, 113, 129, 148, 163; 257/2–5, 257/296, E31.047, E27.006; 438/29, 95, 438/96, 166, 259, 365, 482, 486, 597; 977/754
See application file for complete search history.

(56) References Cited

U.S. PATENT DOCUMENTS

| 6,667,900 | B2 * | 12/2003 | Lowrey et al. ................ 365/171 |
| 6,768,665 | B2 * | 7/2004 | Parkinson et al. ............ 365/113 |
| 2002/0041947 | A1 * | 4/2002 | Chin et al. .................... 428/64.4 |
| 2003/0123284 | A1 * | 7/2003 | Lowrey et al. ................ 365/175 |
| 2006/0072370 | A1 * | 4/2006 | Kuh et al. ..................... 365/232 |
| 2006/0109720 | A1 | 5/2006 | Cho et al. |
| 2006/0151849 | A1 * | 7/2006 | Czubatyj ....................... 257/467 |
| 2006/0291277 | A1 | 12/2006 | Cho et al. |
| 2007/0014150 | A1 | 1/2007 | Cho et al. |
| 2007/0297221 | A1 * | 12/2007 | Philipp et al. ................. 365/163 |
| 2008/0258129 | A1 * | 10/2008 | Toda ................................. 257/5 |

FOREIGN PATENT DOCUMENTS
KR    1020050052375 A    6/2005
* cited by examiner

*Primary Examiner* — Alexander Sofocleous
*Assistant Examiner* — Harry W Byrne
(74) *Attorney, Agent, or Firm* — Ladas & Parry LLP

(57) ABSTRACT

A phase change memory device includes a phase change resistance cell configured to sense a crystallization state that changes in response to a current so that data corresponding to the crystallization state can be stored in the phase change resistance cell. A write driving control signal generating unit outputs a write enable signal and a precharge enable signal in response to a write control signal that corresponds to a heating period and a quenching period of the write data. A write driving unit is configured to supply a driving voltage corresponding to the write data to the phase change resistance cell in response to the write enable signal and the precharge enable signal.

24 Claims, 11 Drawing Sheets

PHASE CHANGE MEMORY DEVICE HAVING WRITE DRIVING CONTROL SIGNAL CORRESPONDING TO SET/RESET WRITE TIME

CROSS-REFERENCE TO RELATED APPLICATIONS

The present application claims priority to Korean Patent Application No. 10-2007-80661 filed on Aug. 10, 2007, which is incorporated herein by reference in its entirety.

BACKGROUND OF THE INVENTION

The present invention relates generally to a phase change memory device, and more particularly, to a phase change memory device generating a write driving control signal corresponding to a set/reset write time, thereby simplifying the configuration of a control circuit and reducing area consumed by the layout of the phase change memory device.

Unlike volatile RAM, nonvolatile memory devices are capable of conserving data even when the power of the device is turned off. Examples of nonvolatile memory include a magnetic memory and a phase change memory (PCM). These memory devices have a data processing speed similar to that of volatile Random Access Memory (RAM) while possessing the capability to maintain data even after the power is turned off.

FIGS. 1a and 1b are diagrams illustrating a conventional phase change resistor (PCR) 4.

The PCR 4 comprises a phase change material (PCM) 2 interposed between a top electrode 1 and a bottom electrode 3. When a voltage is applied and a current is transmitted through the PCR 4, a high temperature is generated in the PCM 2 so that an electric conductive state is changed depending on a change in resistance occurring due to the applied high temperature. The PCM includes AgLnSbTe. Typically, the PCM 2 includes chalcogenide having chalcogen elements (S, Se, Te) as a main ingredient, and more specifically a germanium antimonic tellurium consisting of Ge—Sb—Te.

FIGS. 2a and 2b are diagrams illustrating the operating principle of the conventional PCR 4.

As shown in FIG. 2a, the PCM 2 can be crystallized when a low current, i.e., a current of than a threshold value, flows through the PCR 4. The crystallized PCM 2 has a low resistance.

As shown in FIG. 2b, the PCM 2 becomes amorphous when a high current, i.e., a current more than a threshold value, flows through the PCR 4, since at this time, the temperature resulting from the high current in the PCM 2 is greater than the melting point. The amorphous PCM 2 has a high resistance.

Using this phenomenon, the PCR 4 can be configured to store a nonvolatile data corresponding to the two different resistance states. For example, data logic value "1" corresponds to the crystallized PCR 4 (low resistance state), and a data logic value "0" corresponds to the amorphous PCR 4 (high resistance state), and accordingly the logic states of the data can be stored using the PCR 4.

FIG. 3 is a diagram illustrating a write operation of a conventional phase change resistance cell.

Heat is generated when current flows between the top electrode 1 and the bottom electrode 3 of the PCR 4 for a given amount of time. As a result, the state of the PCM 2 changes to a crystalline or an amorphous state depending on the temperature resulting from the current flowing between the top electrode 1 and the bottom electrode 3.

For example, when a low current flows for a given time, the PCM 2 becomes crystalline due to a low temperature heating state, and thus the PCR 4 is at a low resistance state (set state). Conversely, when a high current flows for a given time, the PCM 2 becomes amorphous due to a high temperature heating state, and thus the PCR 4 is at a high resistance state (reset state). The difference between the two phases is represented by the difference in electric resistance between the two phases.

In the PCR 4, the low voltage required for changing the phase change material to a crystalline state must be applied to the PCR 4 for a long period of time in order to write the set state in a write mode. Conversely, the high voltage required for changing the PCM 2 to an amorphous state need only be applied to the PCR 4 for a short time in order to write the reset state in the write mode.

However, phase change memory devices are not without problems. Each phase change resistance cell in the conventional phase change resistance cell may have different characteristics varying according to several fixed conditions. As such, in a write mode, when data is written to all phase change resistance cells using the same write voltage level, it becomes difficult to write data efficiently since the characteristics of each phase change resistance cell are different.

SUMMARY

The present invention includes a phase change memory device having a write driving control signal corresponding to a set/reset time.

The phase change memory device according to embodiments of the present invention separates a heating time from a quench time of the phase change resistance device to generate reset/set control signals, thereby simplifying the configuration of a control circuit and reducing the layout area.

The phase change memory device according to embodiments of the present invention controls a quench slope of a set pulse using a plurality of option delay circuits, thereby allowing for efficient driving of a set state.

According to one embodiment, a phase change memory device comprises: a phase change resistance cell configured to sense a crystallization state changing in response to currents so that data corresponding to the crystallization state can be stored; a write driving control signal generating unit configured to output a write enable signal and a precharge enable signal in response to a write control signal corresponding to a status of the write data; and a write driving unit configured to supply a driving voltage corresponding to the write data to the phase change resistance cell in response to the write enable signal and the precharge enable signal.

DETAILED DESCRIPTION

Figure 1A:
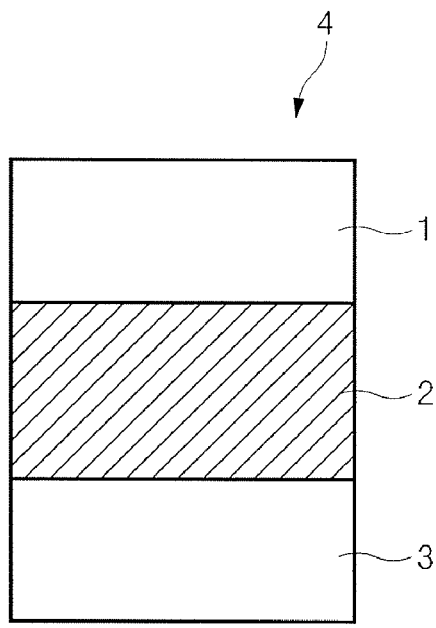
FIGS. 1a and 1b are diagrams illustrating a conventional phase change resistor.
Figure 1B:
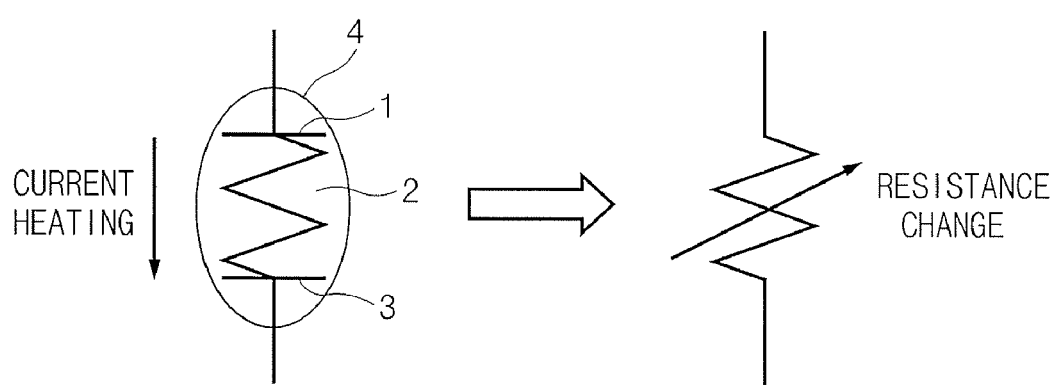
Figure 2A:
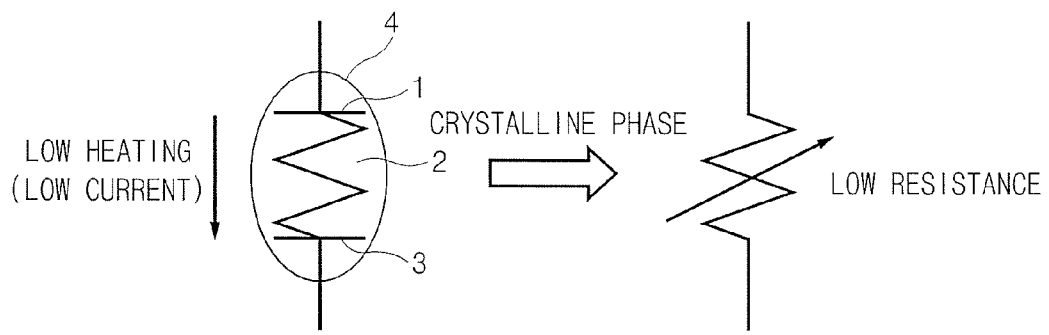
FIGS. 2a and 2b are diagrams illustrating the operation principle of the conventional phase change resistor.
Figure 2B:
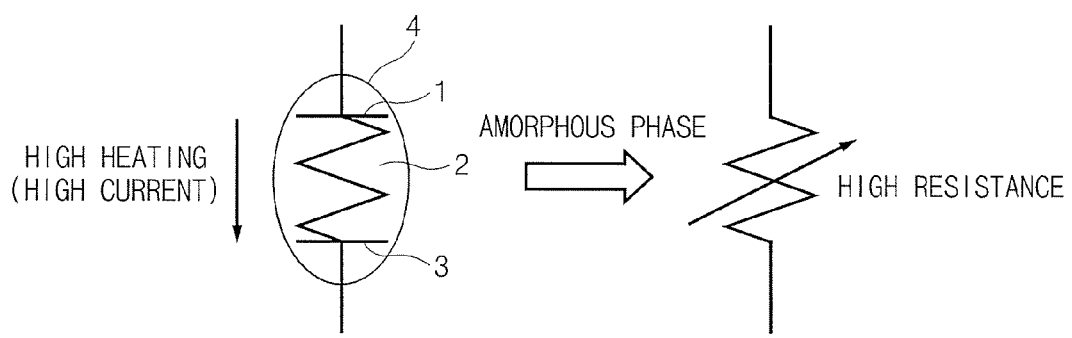
Figure 3:
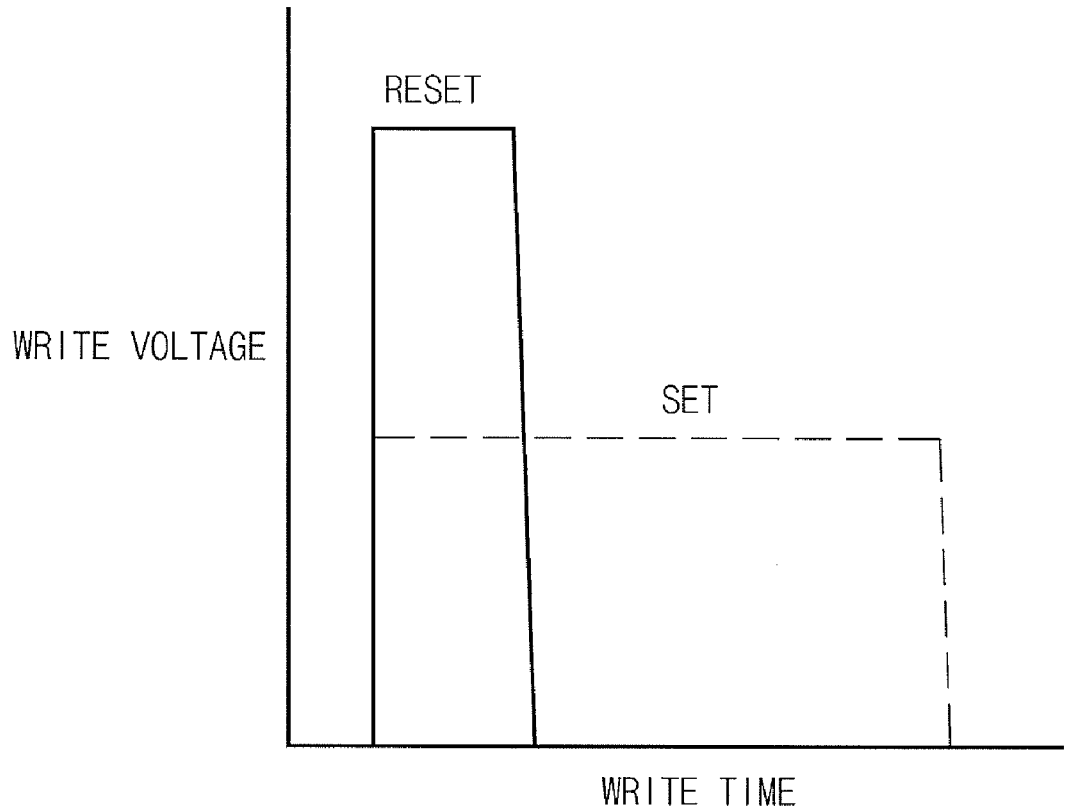
FIG. 3 is a diagram illustrating the write operation of a conventional phase change resistance cell.
Figure 4:
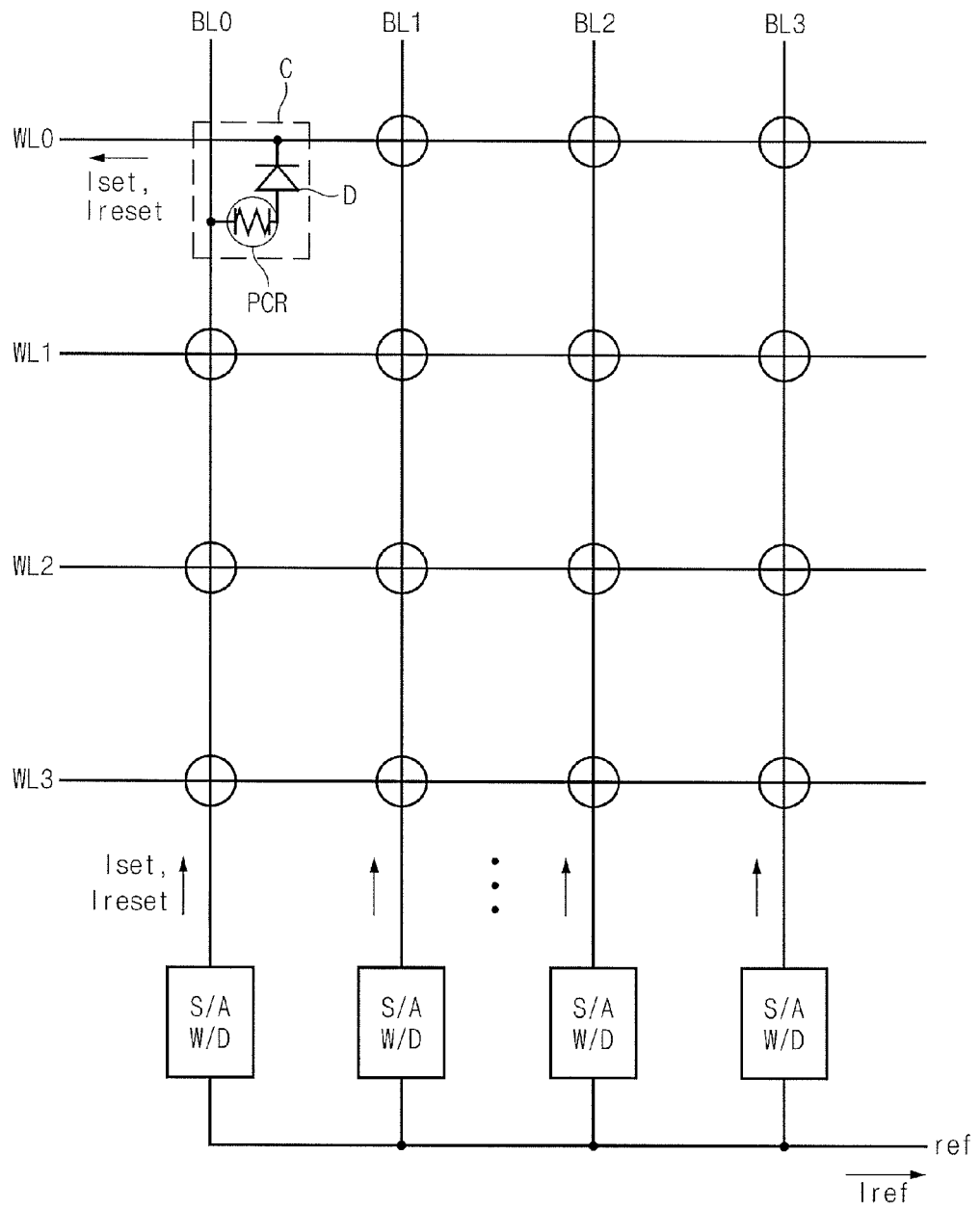
FIG. 4 is a diagram showing the cell array of a phase change memory device according to an embodiment of the present invention.

FIG. 4 is a diagram showing the cell array of a phase change memory device according to an embodiment of the present invention.

Referring to FIG. 4, the phase change memory device includes a plurality of bit lines BL0~BL3 arranged in a row direction and a plurality of word lines WL0~WL3 arranged in a column direction. Each unit cell C of a plurality of unit cells C is arranged where one of the bit lines BL0~BL3 intersects with one of the word lines WL0~WL3. Each unit cell C includes a phase change resistor PCR and a diode D. The diode D comprises a PN diode element.

One electrode of the phase change resistor PCR is connected to the bit line BL and the other electrode is connected to the P-type region of the diode D. The N-type region of the diode D is connected to the word line WL.

During read mode, a low voltage is applied to a selecting word line WL, and a read voltage Vread is applied to the bit line BL, allowing one of a read current Iset (crystalline set state) and a read current Ireset (amorphous reset state) to flow toward the word line WL by traveling through the bit line BL, the phase change resistor PCR, and the diode D.

Each of a plurality of sense amplifiers S/A compares cell data received from a bit line BL to the reference current Iref received from a reference line ref to distinguish a data logic value "1" from a data logic value "0". A write driving unit W/D supplies a driving voltage corresponding to write data to the bit line BL when data is written to the cell.

Figure 5:
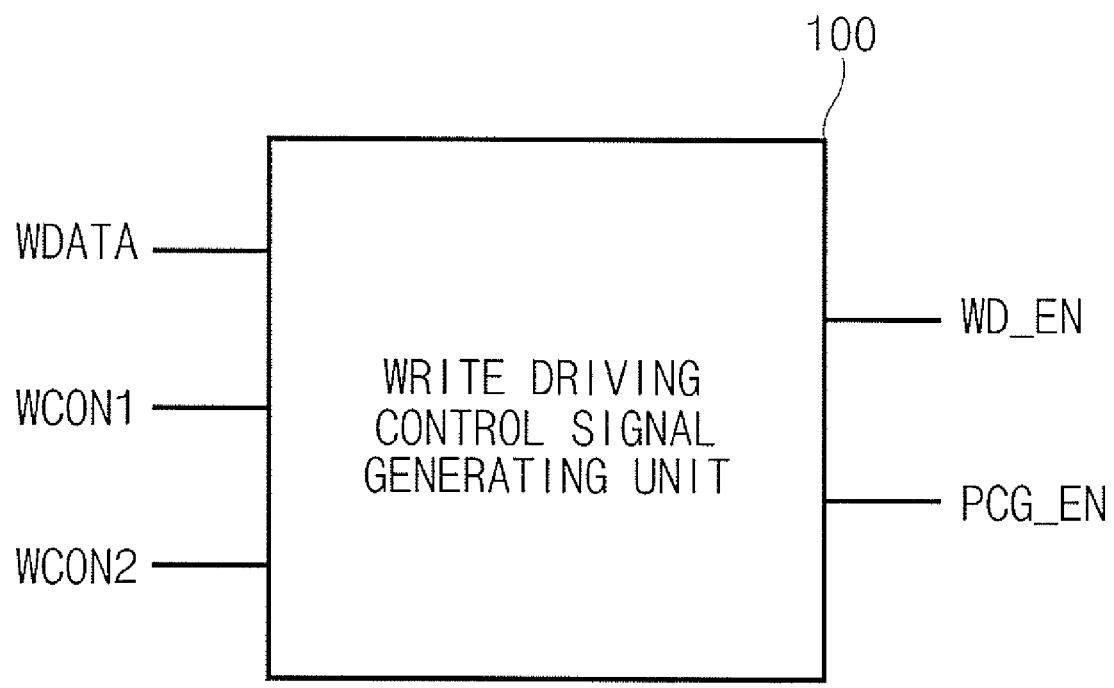
FIG. 5 is a diagram showing a write driving control signal generating unit according to an embodiment of the present invention.

FIG. 5 is a diagram showing a write driving control signal generating unit 100 according to an embodiment of the present invention.

The write driving control signal generating unit 100 outputs a write enable signal WD_EN and a precharge enable signal PCG_EN used for controlling the write driving unit W/D. The write enable signal WD_EN and the precharge enable signal PCG_EN are generated in response to a write data WDATA, a write control signal WCON1, and a write control signal WCON2.

The write enable signal WD_EN is a signal for controlling a write driving output unit 230 (described below), and the precharge enable signal PCG_EN is a signal for controlling a set delay adjusting unit 200 (described below).

The write driving control signal generating unit 100 receives a set data or a reset data as the write data WDATA. When the data inputted in the write driving control signal generating unit 100 is a set data, the write data WDATA is inputted at a low level. When the data is a reset data, the write data WDATA is inputted at a high level.

The enabling period of the write control signal WCON1 is the same enable time as that of the heating period of a reset data. The enabling period of the write control signal WCON2 is the same enable time as that of a cooling period of a set data.

The write period of set data includes the enable periods of the write control signal WCON1 and the write control signal WCON2. The write control signal WCON1 and the write control signal WCON2 are activated complementary with each other during the write period.

Figure 6:
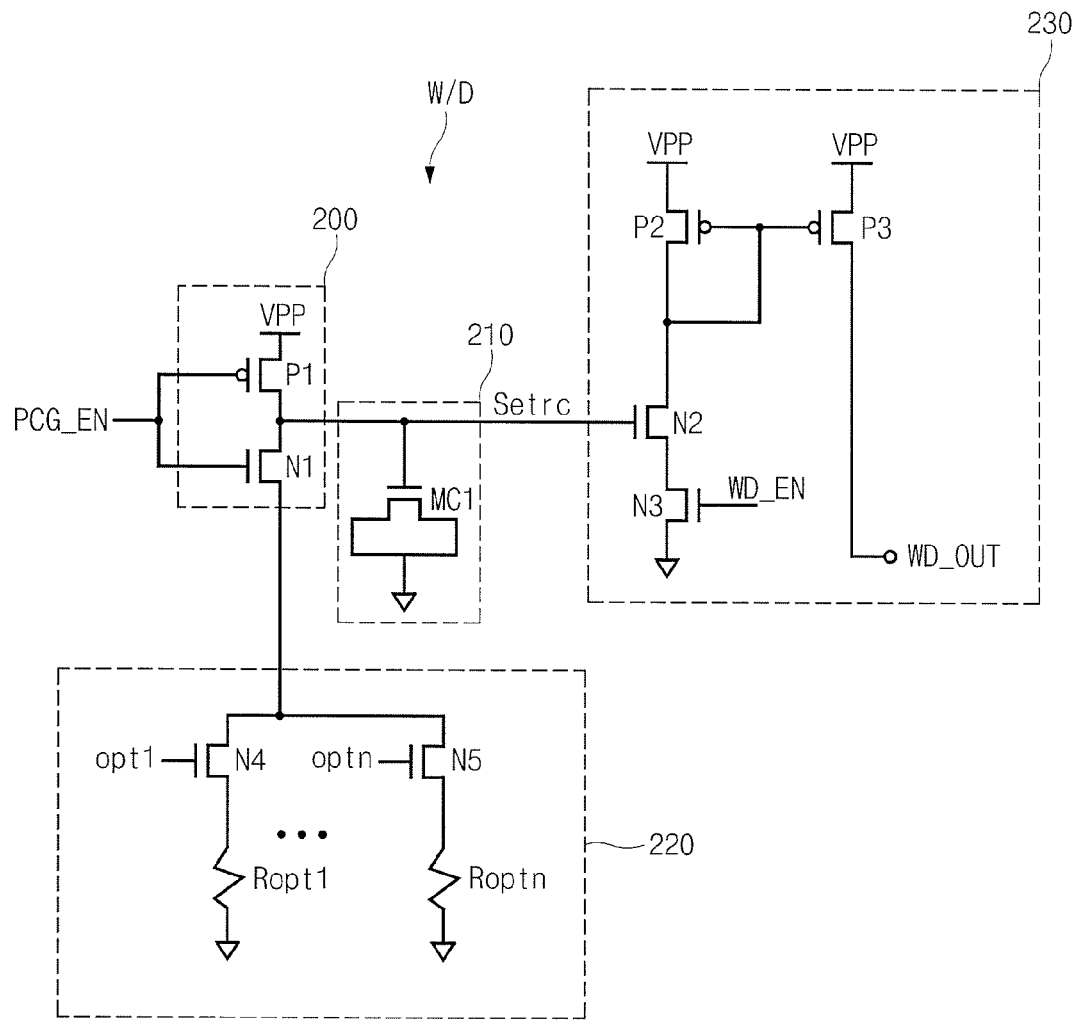
FIG. 6 is a circuit diagram showing the write driving unit of FIG. 4 according to an embodiment of the present invention.

FIG. 6 is a circuit diagram showing the write driving unit W/D of FIG. 4.

The write driving unit W/D includes a set delay adjusting unit 200, a set delay capacity unit 210, a set delay resistance adjusting unit 220, and a write driving output unit 230.

The set delay adjusting unit 200 includes a PMOS transistor P1 and a NMOS transistor N1. The PMOS transistor P1 is connected between a pumping voltage VPP input terminal and a set control signal Setrc output terminal. The NMOS transistor N1 is connected between the set control signal Setrc output terminal and the set delay resistance adjusting unit 220. A common gate of the PMOS transistor P1 and the NMOS transistor N1 receives the precharge enable signal PCG_EN.

The set delay capacity unit 210 includes a MOS capacitor MC1 connected between the set control signal Setrc output terminal and a ground voltage terminal. The set delay resistance adjusting unit 220 includes a plurality of NMOS transistors (in FIG. 6, NMOS transistors N4, N5) and a plurality of option resistors Ropt1~Roptn each of which is connected to one of the NMOS transistors.

The gates of the NMOS transistors N4, N5 connected between the set delay adjusting unit 200 and the option resistors Ropt1~Roptn receive option signals opt1~optn. The option resistors Ropt1~Roptn are connected between the NMOS transistors N4, N5 and the ground voltage terminal.

The write driving output unit 230 includes PMOS transistors P2, P3 and NMOS transistors N2, N3. The PMOS transistor P2 is connected between the pumping voltage VPP input terminal and the NMOS transistor N2. The PMOS transistor P3 is connected between the pumping voltage VPP input terminal and an output terminal where a write output signal WD_OUT is output. A common gate of the PMOS transistors P2, P3 is connected to a drain of the PMOS transistor P2.

The NMOS transistor N2 is connected between the PMOS transistor P2 and the NMOS transistor N3, and the gate of the PMOS transistor P2 receives the set control signal Setrc. The NMOS transistor N3 is connected between the NMOS transistor N2 and the ground voltage terminal, and the gate of the NMOS transistor N2 receives the write enable signal WD_EN.

Figure 7:
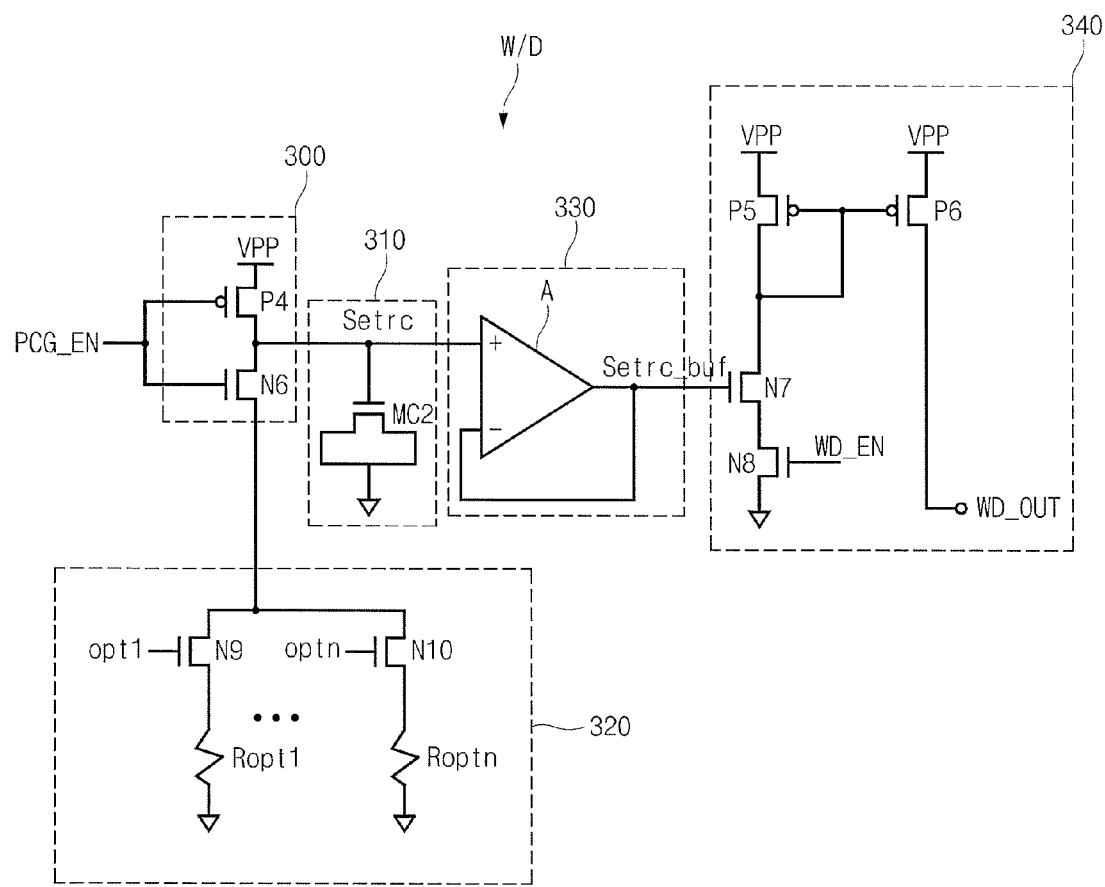
FIG. 7 is a circuit diagram showing the write driving unit of FIG. 4 according to another embodiment of the present invention.

FIG. 7 is diagram showing the write driving unit W/D of FIG. 4 according to another embodiment of the present invention.

The write driving unit W/D includes a set delay adjusting unit 300, a set delay capacity unit 310, a set delay resistance adjusting unit 320, a set delay buffer unit 330, and a write driving output unit 340.

The set delay adjusting unit 300 includes a PMOS transistor P4 and a NMOS transistor N6. The PMOS transistor P4 is connected between a pumping voltage VPP input terminal and a set control signal Setrc output terminal. The NMOS transistor N6 is connected between the set control signal Setrc output terminal and the set delay resistance adjusting unit 320. A common gate of the PMOS transistor P4 and the NMOS transistor N6 receives the precharge enable signal PCG_EN.

The set delay capacity unit 310 includes a MOS capacitor MC2 connected between the set control signal Setrc output terminal and a ground voltage terminal. The set delay resistance adjusting unit 320 includes a plurality of NMOS transistors (in FIG. 7, NMOS transistors N9, N10) and a plurality of option resistors Ropt1~Roptn each of which is connected to one of the NMOS transistors.

The gates of the NMOS transistors N9, N10 connected between the set delay adjusting unit 300 and the option resistors Ropt1~Roptn receive option signals opt1~optn. The option resistors Ropt1~Roptn are connected between the NMOS transistors N9, N10 and the ground voltage terminal.

The set delay buffer unit 330 comprises an amplifier A. The positive (+) terminal of the amplifier A receives a set control signal Setrc, and the negative (−) terminal is connected to the output terminal in a feedback configuration, and the output terminal of the amplifier A outputs a set control signal Setrc_buf. That is, the amplifier A compares the set control signal Setrc_buf with the set control signal Setrc to output the set control signal Setrc_buf.

The amplifier A buffers the set control signal Setrc to improve the characteristics of the set control signal Setrc_buf. The amplifier A buffers the set control signal Setrc to output the set control signal Setrc_buf whose waveform does not change.

The write driving output unit 340 includes PMOS transistors P5, P6 and NMOS transistors N7, N8. The PMOS transistor P5 is connected between the pumping voltage VPP input terminal and the NMOS transistor N7. The PMOS transistor P6 is connected between the pumping voltage VPP input terminal and an output terminal where a write output signal WD_OUT is output. A common gate of the PMOS transistors P5, P6 is connected to a drain of the PMOS transistor P5.

The NMOS transistor N7 is connected between the PMOS transistor P5 and the NMOS transistor N8, and the gate of the PMOS transistor P5 receives the set control signal Setrc_buf. The NMOS transistor N8 is connected between the NMOS transistor N7 and the ground voltage terminal, and the gate of the NMOS transistor N7 receives the write enable signal WD_EN.

Figure 8:
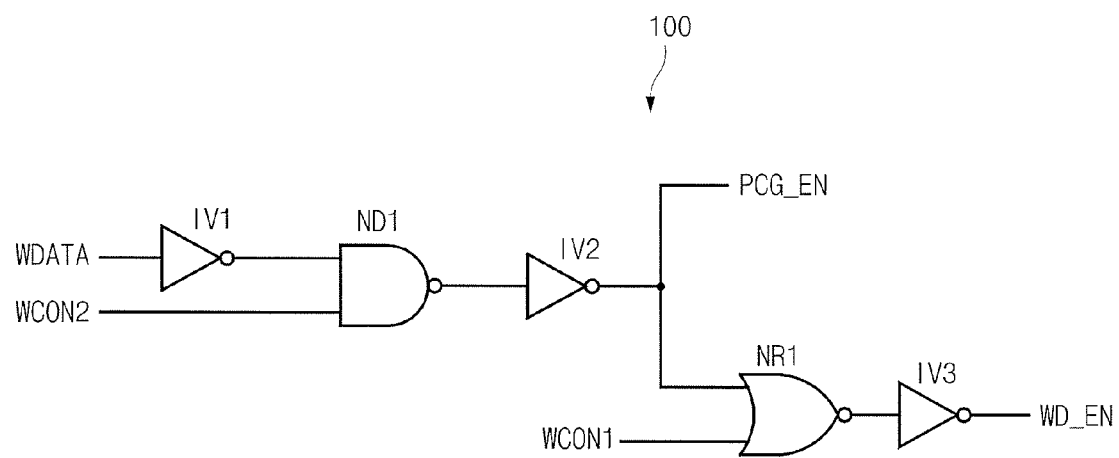
FIG. 8 is a circuit diagram showing the write driving control signal generating unit of FIG. 5.

FIG. 8 is a circuit diagram showing the write driving control signal generating unit 100 of FIG. 5.

The write driving control signal generating unit 100 includes a precharge signal generating unit and a write enable signal generating unit. The precharge signal generating unit includes inverters IV1, IV2 and a NAND gate ND1. The write enable signal generating unit includes a NOR gate NR1 and an inverter IV3.

The inverter IV1 inverts the write data WDATA. The NAND gate ND1 performs a NAND logical operation on the write control signal WCON2 and the inverted write data WDATA. The inverter IV2 inverts the output signal of the NAND gate ND1 to output the precharge enable signal PCG_EN. The NOR gate NR1 performs a NOR logical operation on the precharge enable signal PCG_EN and the write control signal WCON1. The inverter IV3 inverts the output signal of the NOR gate NR1 to output the write enable signal WD_EN.

Figure 9:
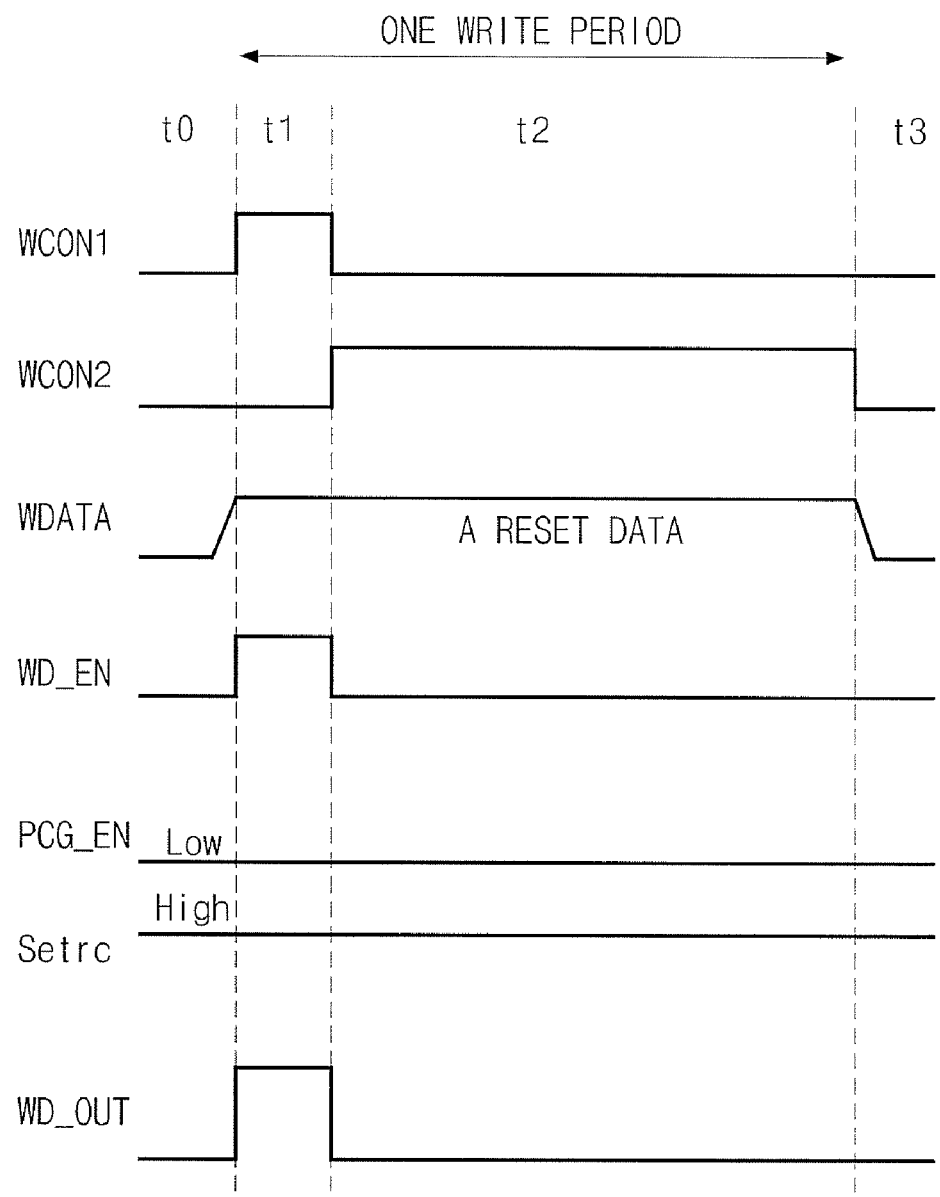
FIG. 9 is a timing diagram shown for illustrating a reset data write operation of a phase change memory device according to an embodiment of the present invention.

FIG. 9 is a timing diagram shown for illustrating a reset data write operation of a phase change memory device according to an embodiment of the present invention. As an example, the reset data write operation is explained with reference to the write driving unit W/D of FIG. 6.

During period t0, the write control signals WCON1, WCON2 maintain a 'low'. The write data WDATA also maintains a 'low'. As a result, the write enable signal WD_EN and the precharge enable signal PCG_EN maintain a 'low'.

When the precharge enable signal PCG_EN is at the low level, the PMOS transistor P1 is turned on so that the set control signal Setrc becomes 'high'. When the set control signal Setrc is at the high level, the set control signal Setrc terminal is charged with a pumping voltage VPP level, and the MOS transistor N2 is turned on. When the write enable signal WD_EN is at the low level, the NMOS transistor N3 is turned off so that the write output signal WD_OUT maintains 'low'.

Period t1+t2 is a basic write period (one write period). The entire write cycle period includes a single write period used one or more times to perform the write operation. That is, the write period may be repeated several times during a write cycle operation method for write verification.

During period to, the write control signal WCON1 transits to a high voltage level, and the write data WDATA is inputted at a high voltage level. The write control signal WCON1 has the same enable period (t1) as that of the heating period of reset data. As a result, the write enable signal WD_EN transits to a high voltage level, and the precharge enable signal PCG_EN maintains a 'low'.

When the precharge enable signal PCG_EN is at the low level, the PMOS transistor P1 is turned on so that the set control signal Setrc becomes 'high'. When the set control signal Setrc is at the high level, the NMOS transistor N2 is turned on. When the write enable signal WD_EN is at the high voltage level, the NMOS transistor N3 is turned on and the PMOS transistors P2, P3 are turned on. As a result, the write output signal WD_OUT transits to a high voltage level.

During period t2, the write control signal WCON1 transits to a low voltage level and the write control signal WCON2 transits to a high voltage level. The write control signal WCON2 has the same enable time (t2) as that of the quench time of set data.

During period t2, the write data WDATA maintains a 'high'. That is when the write data WDATA is a data logic value "1" (reset data), the write data WDATA maintains a 'high' for one write period.

During the time period t2, the write enable signal WD_EN transits to a low voltage level, and the precharge enable signal PCG_EN maintains a 'low'. The write enable signal WD_EN has the same waveform as that of the write control signal WCON1.

When the precharge enable signal PCG_EN is at the low level, the PMOS transistor P1 is turned on and the set control signal Setrc maintains a 'high'. When the set control signal Setrc is at the high level, the NMOS transistor N2 is turned on.

When the write enable signal WD_EN is at the low voltage level, the NMOS transistor N3 is turned off. As a result, the write output signal WD_OUT transits to a low voltage level. The write output signal WD_OUT has the same waveform as that of the write control signal WCON1.

During period t3, the write control signal WCON2 and the write data WDATA transit to a low voltage level.

Figure 10:
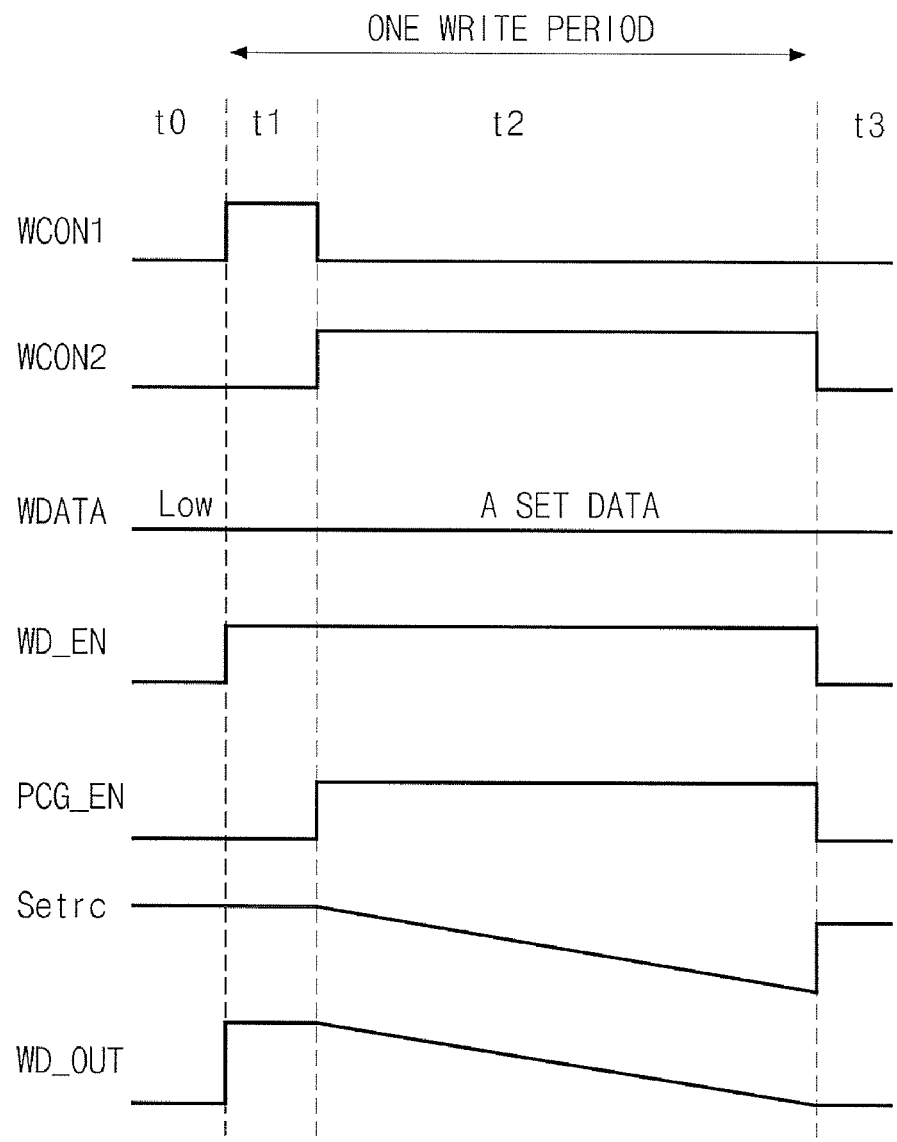
FIG. 10 is a timing diagram shown for illustrating a set data write operation of a phase change memory device according to an embodiment of the present invention.

FIG. 10 is a timing diagram shown for illustrating a set data write operation of a phase change memory device according to an embodiment of the present invention. As an example, the set data write operation is explained with reference to the write driving unit W/D of FIG. 6.

During period t0, the write control signals WCON1, WCON2 maintain a 'low'. The write data WDATA also maintains a 'low'. As a result, the write enable signal WD_EN and the precharge enable signal PCG_EN maintain a 'low'.

When the precharge enable signal PCG_EN is at the low level, the PMOS transistor P1 is turned on so that the set control signal Setrc becomes a 'high'. When the set control signal Setrc is at the high level, the MOS transistor N2 is turned on. When the write enable signal WD_EN is at the low level, the NMOS transistor N3 is turned off so that the write output signal WD_OUT maintains a 'low'.

Period t1+t2 is a basic write period (one write period). The entire write cycle period includes a single write period used one or more times to perform the write operation. That is, the write period may be repeated several times in a write cycle operation method for write verification.

During period t1, the write control signal WCON1 transits to a high voltage level, and the write data WDATA is inputted at a low voltage level. The write control signal WCON1 has the same enable period (t1) as that of the heating period of reset data. As a result, the write enable signal WD_EN transits to a high voltage level, and the precharge enable signal PCG_EN maintains a 'low'.

When the precharge enable signal PCG_EN is at the low level, the PMOS transistor P1 is turned on so that the set control signal Setrc becomes a 'high'. When the set control signal Setrc is at the high level, the NMOS transistor N2 is turned on. When the write enable signal WD_EN is at the high voltage level, the NMOS transistor N3 is turned on and the PMOS transistors P2, P3 are turned on. As a result, the write output signal WD_OUT transits to a high voltage level.

During period t2, the write control signal WCON1 transits to a low voltage level and the write control signal WCON2 transits to a high voltage level. The write control signal WCON2 has the same enable time (t2) as that of the quench time of set data.

The write data WDATA maintains a 'low'. That is, when the write data WDATA is data "0" or a set data, the write data WDATA maintains the 'low' for one write period. The write enable signal WD_EN maintains a 'high', and the precharge enable signal PCG_EN transits to a high voltage level.

When the precharge enable signal PCG_EN is at the high level, the NMOS transistor N1 is turned on. When the precharge enable signal PCG_EN is at the high voltage level, a charging current of the set control signal Setrc terminal is discharged to an invariable RC time by the selection of the option resistors Ropt1~Roptn.

A voltage level of the set control signal Setrc is gradually decreased depending on an output voltage of the set delay resistance adjusting unit 220. A discharging slope of the set control signal Setrc is altered by the option resistors Ropt1~Roptn.

The NMOS transistor N2 is turned off as the set control signal Setrc is gradually decreased to the low voltage level during the period t2. When the write enable signal WD_EN is at the high voltage level, the NMOS transistor N3 is turned on. As a result, the voltage level of the write output signal WD_OUT is gradually decreased to the low voltage level in response to the set control signal Setrc.

While the write enable signal WD_EN is activated to the high voltage level, the voltage level of the set control signal Setrc is decreased by a given slope. As a result, a voltage level of the write output signal WD_OUT is decreased depending on a slope function of the characteristic of the set control signal Setrc.

The voltage level of the write output signal WD_OUT is determined by the slope of the set control signal Setrc. The reset waveform of the write output signal WD_OUT is generated in response to the write control signal WCON2 for the period t2, and the waveform decreases by a given slope according to the set control signal Setrc for the period t2.

During period t3, the write control signal WCON2, the write enable signal WD_EN, and the precharge enable signal PCG_EN transit to the low voltage level. The set control signal Setrc transits to the high voltage level.

The write enable signal WD_EN has a waveform obtained by performing a logic operation on the write control signal WCON1 and the write control signal WCON2. The precharge enable signal PCG_EN has the same waveform as that of the write control signal WCON2.

Figure 11:
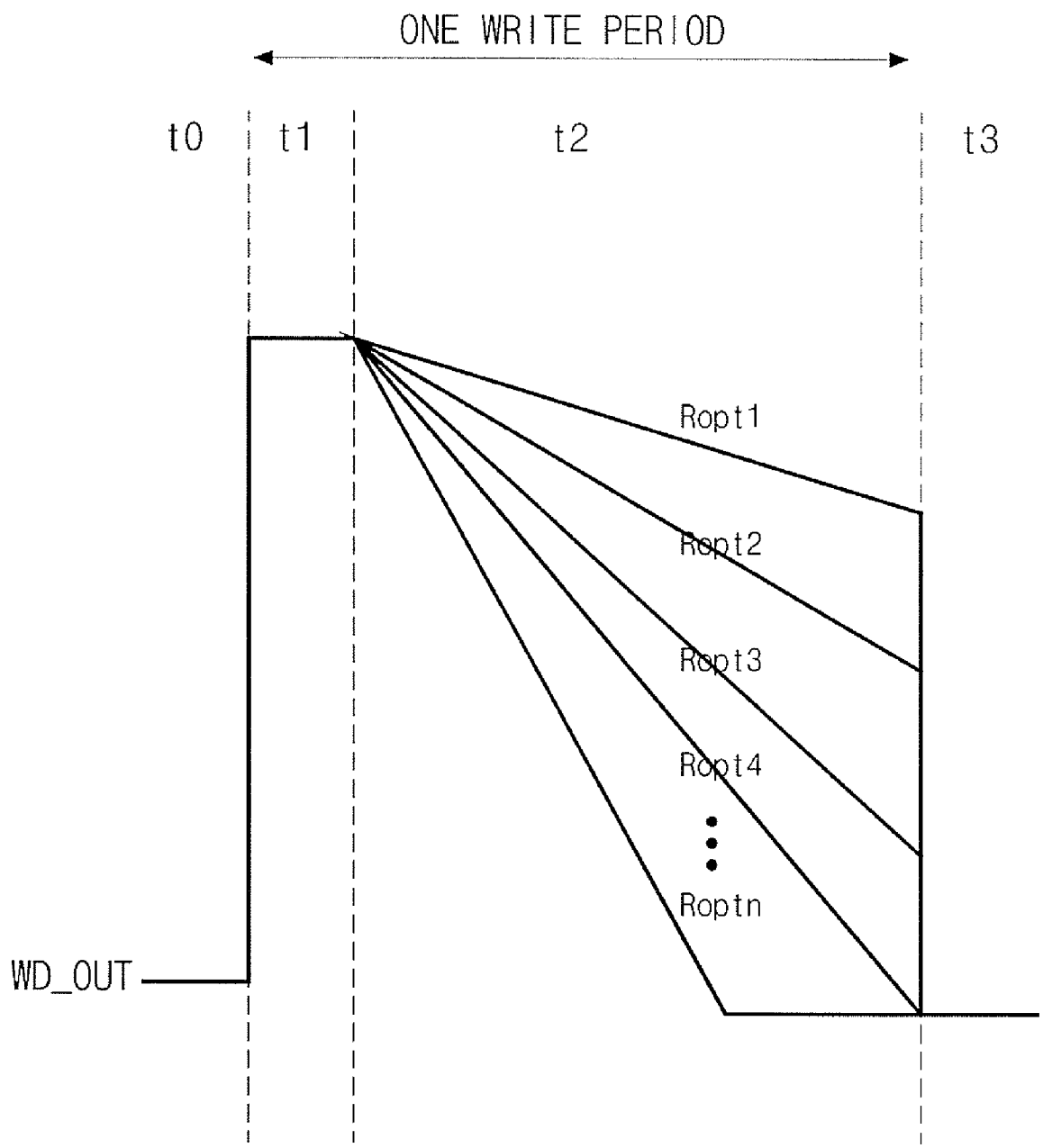
FIG. 11 is a diagram shown for illustrating an output waveform of a write driving unit depending on option resistance selection according to an embodiment of the present invention.

FIG. 11 is a diagram shown for illustrating the output waveform of a write driving unit corresponding to the selected option resistance according to an embodiment of the present invention.

During period t0, the write output signal WD_OUT maintains a 'low'. during period t1, the write output signal WD_OUT maintains a 'high'.

During period t2, the voltage level of the write output signal WD_OUT gradually decreases to the low voltage level. The degree of slope of the decreasing voltage level of the write output signal WD_OUT changes according to the set delay resistance adjusting unit 220.

That is, the number of NMOS transistors N4, N5 turned on in response to the plurality of option signals opt1~optn can be regulated. One of the option resistors Ropt1~Roptn is selected using the NMOS transistors N4, N5 in response to one of the option signals opt1~optn.

The voltage level of the set control signal Setrc is changed depending on the resistance value of the one option resistor selected from the plurality of option resistors Ropt1~Roptn, so that the voltage level slope of the write output signal WD_OUT may be altered.

As described above, in a phase change memory device according to an embodiment of the present invention, the melting time is separated from the quench time of a phase change resistance device to generate reset/set control signals, thereby simplifying the configuration of a control circuit and reducing the layout area.

In the phase change memory device according to an embodiment of the present invention, a quench slope of a set pulse is controlled using a plurality of option delay circuits, thereby providing efficient driving for the set state.

Although a number of illustrative embodiments consistent with the invention have been described, it should be understood that numerous other modifications and embodiments can be devised by those skilled in the art that will fall within the spirit and scope of the present invention. More particularly, a number of variations and modifications are possible in the component parts and/or arrangements that are within the scope of the disclosure, the drawings, and the accompanying claims. In addition to variations and modifications in the component parts and/or arrangements, alternative uses will also be apparent to those skilled in the art.

What is claimed is:

1. A phase change memory device comprising:
    a phase change resistance cell storing write data corresponding to the phase of the phase change resistance cell;
    a write driving control signal generating unit configured to output a write enable signal and a precharge enable signal in response to a write control signal having periods of enablement corresponding to a status of the write data; and
    a write driving unit configured to supply a driving voltage corresponding to the phase of the write data to be written to the phase change resistance cell in response to the write enable signal and the precharge enable signal,
    wherein the write control signal includes a first write control signal having an enable period that is the same as a heating period of a reset data, and a second control signal having an enable period that is the same as a quench period of a set data.

2. The phase change memory device according to claim 1, wherein the first write control signal and the second write control signal are activated complementarily to each other during a write period, such that the second write period is disabled when the first write period is enabled and the first write period is disabled when the second write period is enabled.

3. The phase change memory device according to claim 1, wherein the write driving control signal generating unit sets a write period of the set data as the sum of the enable periods of the first write control signal and the second write control signal.

4. The phase change memory device according to claim 1, wherein the write driving control signal generating unit comprises:
a precharge signal generating unit configured to output the precharge enable signal in response to the write data and the second write control signal; and
a write enable signal generating unit configured to output the write enable signal in response to the precharge enable signal and the first write control signal.

5. The phase change memory device according to claim 4, wherein the precharge signal generating unit comprises:
a first inverter configured to invert the write data;
a NAND gate configured to perform a NAND logical operation on the second write control signal and the inverted write data; and
a second inverter configured to invert an output signal of the NAND gate.

6. The phase change memory device according to claim 4, wherein the write enable signal generating unit comprises:
a NOR gate configured to perform a NOR logical operation on the precharge enable signal and the first write control signal; and
a third inverter configured to invert an output signal of the NOR gate to output the write enable signal.

7. The phase change memory device according to claim 1, wherein the first write control signal, the write enable signal, and the driving voltage are enabled to have the same waveform when writing the reset data.

8. The phase change memory device according to claim 7, wherein the precharge enable signal maintains an inactivated state when writing the reset data.

9. The phase change memory device according to claim 1, wherein the write enable signal is activated for the sum of the enable periods of the first write control signal and the second write control signal when writing the set data.

10. The phase change memory device according to claim 9, wherein the precharge enable signal and the second write control signal are enabled to have the same waveform.

11. The phase change memory device according to claim 9, wherein the write driving unit comprises:
a set delay resistance adjusting unit configured to select an option resistance value in response to an option signal;
a set delay adjusting unit configured to control a set control signal in response to the precharge enable signal;
a set delay capacity unit configured to discharge a set control signal terminal; and
a write driving output unit configured to control a level of the driving voltage in response to the write enable signal and the set control signal.

12. The phase change memory device according to claim 11, wherein the set delay resistance adjusting unit comprises:
a plurality of option resistors connected to a ground voltage terminal; and
a plurality of option switches each configured to selectively control connection of one of the plurality of option resistors to the set delay adjusting unit in response to the option signal.

13. The phase change memory device according to claim 11, wherein the set delay adjusting unit precharges the set control signal when the precharge enable signal is inactivated, and controls the set control signal according to an output signal of the set delay resistance adjusting unit when the precharge enable signal is activated.

14. The phase change memory device according to claim 11, wherein the set delay capacity unit comprises a MOS capacitor connected between the ground voltage terminal and the set control signal terminal.

15. The phase change memory device according to claim 11, wherein the write driving output unit includes:
a second NMOS transistor controlled by the set control signal;
a third NMOS transistor connected between the second NMOS transistor and the ground voltage terminal, and having a gate receiving the write enable signal;
a second PMOS transistor connected between the second NMOS transistor and a pumping voltage input terminal, and having a gate connected to its drain; and
a third PMOS transistor connected between the pumping voltage input terminal and a driving voltage output terminal, and having a gate connected to the gate of the second PMOS transistor.

16. The phase change memory device according to claim 11, wherein the write driving unit further comprises a set delay buffer unit connected to the set control signal terminal and configured to buffer the set control signal to output the set control signal to the write driving output unit.

17. The phase change memory device according to claim 16, wherein the set delay buffer unit comprises an amplifier configured to receive the set control signal and the output signal of the amplifier as feedback.

18. The phase change memory device according to claim 11, wherein the write driving unit activates the write enable signal when writing the reset data, and activates the set control signal when the precharge enable signal is inactivated to output the driving voltage at a high level.

19. The phase change memory device according to claim 11, wherein the write driving unit activates the write enable signal when writing the set data, and activates the set control signal when the precharge enable signal is inactivated to output the driving voltage at a high level.

20. The phase change memory device according to claim 11, wherein the write driving unit discharges a charging current of the set control signal terminal according to the set delay resistance adjusting unit when the precharge enable signal is activated.

21. The phase change memory device according to claim 11, wherein the write driving unit decreases a voltage level of the set control signal according to an output voltage of the set delay resistance adjusting unit, when the write enable signal and the precharge enable signal are activated when writing the set data.

22. The phase change memory device according to claim 11, wherein a slope of the set control signal is adjusted in response to the option signal.

23. The phase change memory device according to claim 11, wherein the level of the driving voltage decreases according to the slope of the set control signal.

24. The phase change memory device according to claim 1, wherein the driving voltage has a reset waveform in response to the first write control signal, and has a waveform decreased by a predetermined slope in response to the second write control signal.

* * * * *